United States Patent [19]

Miller et al.

[11] Patent Number: 5,251,095
[45] Date of Patent: Oct. 5, 1993

[54] LOW TEMPERATURE CONDUCTION MODULE FOR A CRYOGENICALLY-COOLED PROCESSOR

[75] Inventors: William C. Miller, Owego, N.Y.; Russell N. Smith, Friendsville, Pa.; Randall J. Stutzman, Vestal, N.Y.

[73] Assignee: International Business Machines Corporation, Armonk, N.Y.

[21] Appl. No.: 922,901

[22] Filed: Jul. 31, 1992

[51] Int. Cl.$^5$ .............................................. H05K 7/20
[52] U.S. Cl. .................................... 361/694; 165/80.3; 165/80.4; 165/104.33; 174/15.2; 174/15.4; 361/382; 361/385; 361/386; 361/388; 361/687; 361/690; 361/698; 361/707
[58] Field of Search ............................. 62/259.1, 259.2; 165/80.3, 80.4, 104.33; 174/15.2, 15.4; 361/380, 382-389, 392, 394-395, 399, 398, 413-415, 428

[56] References Cited

U.S. PATENT DOCUMENTS

| | | | |
|---|---|---|---|
| 3,812,402 | 5/1974 | Garth | 317/100 |
| 3,851,221 | 11/1974 | Beaulieu et al. | 361/382 |
| 3,917,370 | 11/1975 | Thornton et al. | 361/382 |
| 4,466,255 | 8/1984 | Roush | 62/259.2 |
| 4,970,868 | 11/1990 | Grebe et al. | 62/51.1 |
| 5,006,925 | 4/1991 | Bregman et al. | 357/82 |
| 5,121,292 | 6/1992 | Bell et al. | 174/15.4 |
| 5,142,443 | 8/1992 | Moore, Jr. | 361/385 |
| 5,162,974 | 11/1992 | Currie | 361/382 |
| 5,173,838 | 12/1992 | Wessely | 361/382 |

OTHER PUBLICATIONS

"Conductive Cooled Processor & Main Memory at Cryogenic Temperatures" by H. A. Carlson et al.; IBM Bull.; vol. 32, No. 10A (Mar. 1990).

"Nitrogen-Cooled Central Electronics Complex" by H. A. Carlson et al.; IBM Bulletin; vol. 32, No. 10A, Mar. 1990.

*Primary Examiner*—Gregory D. Thompson
*Attorney, Agent, or Firm*—Baker, Maxham, Jester & Meador

[57] ABSTRACT

A hermetic electronic assembly incorporating cryogenically-cooled and air-cooled elements in an integrated assembly. A hermetic cryogenically-cooled enclosure is disposed in close physical proximity to one or more air-cooled circuit cards to minimize physical separation, thereby optimizing signal bandwidth and noise immunity. The air-cooled circuit cards, which generate substantial heat but do not require low operating temperatures, are thermally decoupled from the cryogenically-cooled elements to optimize cryo-cooler efficiency by reserving cooling capacity for the temperature-sensitive processor elements mounted within an evacuated hermetic enclosure. Thus, thermal isolation and physical/electrical proximity are preserved in the same package.

8 Claims, 2 Drawing Sheets

LOW TEMPERATURE CONDUCTION MODULE FOR A CRYOGENICALLY-COOLED PROCESSOR

BACKGROUND OF THE INVENTION

Field of the Invention

This invention relates generally to integrated cooling apparatus for electronic circuits and, more particularly, to a conduction module for integrated packaging of air-cooled and cryogenically-cooled electronic circuits.

Discussion of the Related Art

Recent advances in the microelectronics arts have led to increased device densities. Several device technologies, such as the complementary metal-oxide semiconductor (CMOS) device technologies, operate advantageously at cryogenic temperatures. The design and fabrication of cryogenically-cooled semiconductor circuits involves engineering design tradeoffs among device power dissipation, cost, operating temperature and cooling efficiency. Ideally, requisite cryogenic cooling capacity is limited to no more than the amount necessary to remove heat losses from the low-temperature components. Such capacity is wasted when used to remove heat leakage from components that do not benefit from reduced operating temperatures.

For instance, in a typical low-temperature computer processor, the CMOS processor chips can advantageously exploit low operating temperatures but the associated memory chips main memory and channel l/o can operate equally well at higher non-cryogenic operating temperatures. Moreover, the main memory generally lose much more power as heat than do CMOS processor chips. Accordingly, optimal cooler efficiency and capacity (cost) is achieved by cooling only the CMOS processor chips and isolating the associate the main memory and channel l/o from the cryogenic-cooling apparatus. Unfortunately, computer processor performance efficiency requires a high signal bandwidth between processor and memory. The best method known in the art for optimizing processor-memory bus bandwidth and noise immunity is to locate the memory chips-.Physically close to the processor chips, thereby minimizing data bus signal line capacitance and inductance. This requirement for physical proximity is then traded off against the thermal isolation requirement for cryogenic-cooling efficiency because physical proximity generally precludes thermal isolation.

Practitioners in the art have proposed solutions to this tradeoff problem with some success. The common solution to this problem is to provide a thermal isolation barrier between a cryogenic-cooling chamber containing the processor chips and an adjacent chamber containing the associated memory chips, which are cooled convectively in the normal manner. This well-known compromise affects cryogenic cooling efficiency because of heat leakage through the insulating barrier. This heat arises from the warmer memory chips and forces the cryogenic-cooling design capacity above what is necessary for the processor chips alone. The method also affects signal bandwidth because of the increased capacitance and inductance introduced in the processor-memory signal bus by the requisite insulating barrier penetrations. This increased reactance imposes an undesirable upper limit on signal bandwidth between processor and memory and also increases signal bus susceptibility to electromagnetic interference (EMI).

More recently, practitioners have proposed more sophisticated arrangements for improving this tradeoff between thermal efficiency and data bandwidth. For instance, H.A. Carleson et al (IBM Technical Disclosure Bulletin, Vol. 32, No. 10A, pp. 67-68, March 1990) propose a conductively-cooled processor and memory arrangement employing an evacuated cryogenic chamber. Carleson et al propose a cooling support frame mounted directly to a cryogenic-cooling head within an evacuated cryogenic chamber. The processor chips are directly mounted to the cooling support frame and the memory chips are mounted on boards in layers above the processor chip. The memory board edge mounts increase the thermal resistance of the memory chip mounting path relative to the processor path so that the processor chips are cooled to a temperature lower than are the memory chips. However, the memory chips still use a significant amount of cryogenic-cooling capacity because they are numerous and share a single evacuated cryogenic chamber with the processor. Also, the evacuated cryogenic chamber must be made much larger than necessary for the CPU chips alone.

H.A. Carleson et al propose an alternative arrangement (IBM Technical Disclosure Bulletin, Vol. 32, No. 10A, pp. 74-75 March 1990) that reduces the necessary cryogenic chamber size and improves cooler efficiency by employing a two-stage cryo-cooler. However, their second proposal requires an insulating barrier between a second-stage cold-head disposed in a liquid nitrogen chamber containing the processor chips and a first-stage cold-head disposed in a primary (convection) chamber containing the memory. Moreover, the memory heat losses still impose a wasteful burden on the cryo-cooler first-stage, consuming cooling capacity that should be provided by other cheaper cooling sources. The insulating barrier required in their alternate proposal introduces the same barrier penetration signal line reactance problems as are known in the art.

Accordingly, there is a clearly felt need for an improved method for enhanced processor-memory communication bandwidth and a noise immunity without an accompanying loss of cryogenic-cooling efficiency and capacity. These unresolved problems and deficiencies are clearly felt in the art and are solved by this invention in the manner described below.

SUMMARY OF THE INVENTION

This invention introduces for the first time a Low Temperature Conduction Module (LTCM) design that employs a hermetic multi-layer circuit board to mount air-cooled circuit cards to a cryogenically-cooled processor module, forming a single integrated package.

It is a purpose of this invention to reduce or eliminate the signal delay between processor module and circuit cards associated with thermal separation between the two elements.

It is a feature of this invention that the physical proximity of air-cooled circuit boards and cryogenically-cooled processor elements improves control of electromagnetic interference (EMI) in the signal path between processor and circuit boards.

The LTCM of this invention includes four elements: (a) a hermetic mechanical enclosure, (b) a processor module, (c) a hermetic multi-layer circuit board and (d) a short flexible bus cable. The processor module is disposed in direct physical contact with a cryogenic cold head and is cooled by conduction. The hermetic multi-layer circuit board is disposed as part of the mechanical enclosure, thereby creating a hermetically-sealed unit. The flexible bus cable provides the data signal path between air-cooled circuit boards and processor module. The air-cooled circuit boards are mounted to the hermetic multi-layer circuit board by edge connectors on the outside of the mechanical enclosure where they are cooled by convective air flow.

An advantage of the LTCM of this invention is inherent in the hermetic multi-layer circuit board, which reduces the size and number of barrier penetrations, thereby minimizing the signal bandwidth degradation and EMI between processor and circuit cards while ensuring thermal isolation of the hermetically-sealed unit.

The foregoing, together with other objects, features and advantages of this invention, will become more apparent when referring to the following specification, claims, and the accompanying drawing.

BRIEF DESCRIPTION OF THE DRAWINGS

For a more complete understanding of this invention, reference is now made to the following detailed description of the embodiments as illustrated in the accompanying drawing, wherein.

DETAILED DESCRIPTION OF THE PREFERRED EMBODIMENTS

Figure 1:
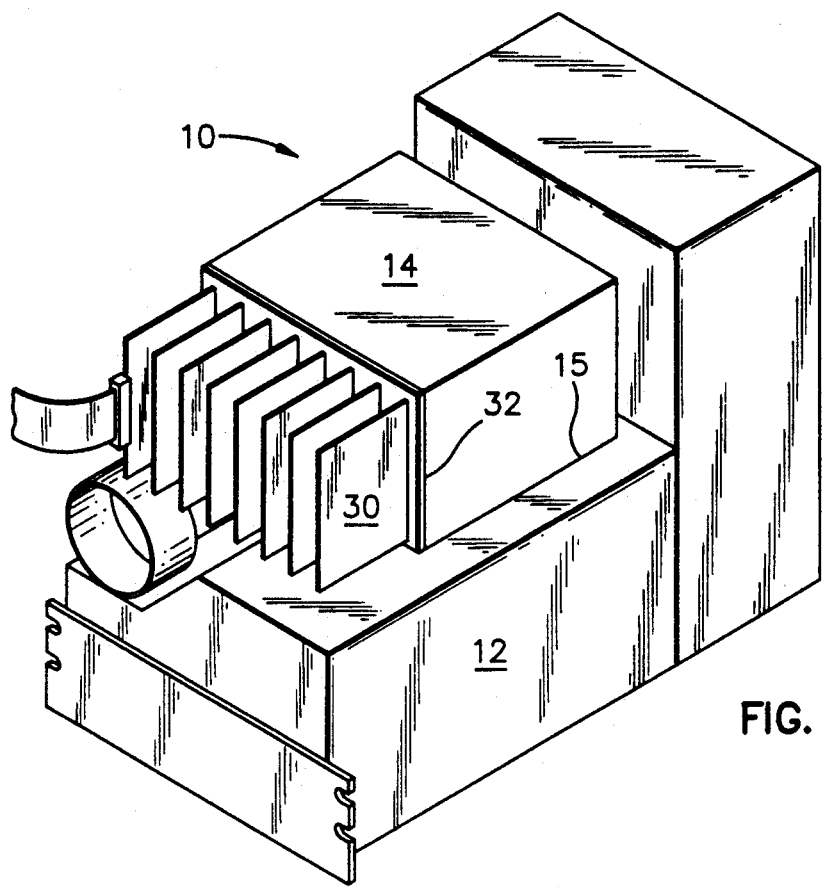
FIG. 1 shows the LTCM of this invention mounted to a cryogenic cooling module.

FIG. 1 shows the Low Temperature Conduction Module (LTCM) 10 of this invention mounted to a cryogenic cooler assembly 12. LTCM 10 includes a hermetic enclosure 14 that fastens directly to cooler 12. The juncture 15 of cooler assembly 12 and enclosure 14 is hermetically sealed by any means suitable for low temperatures, such as a beryllium-copper O-Ring. The interior of enclosure 14 is evacuated to a hard vacuum of about one micropascal absolute to ensure complete removal of all water vapor.

Figure 2:
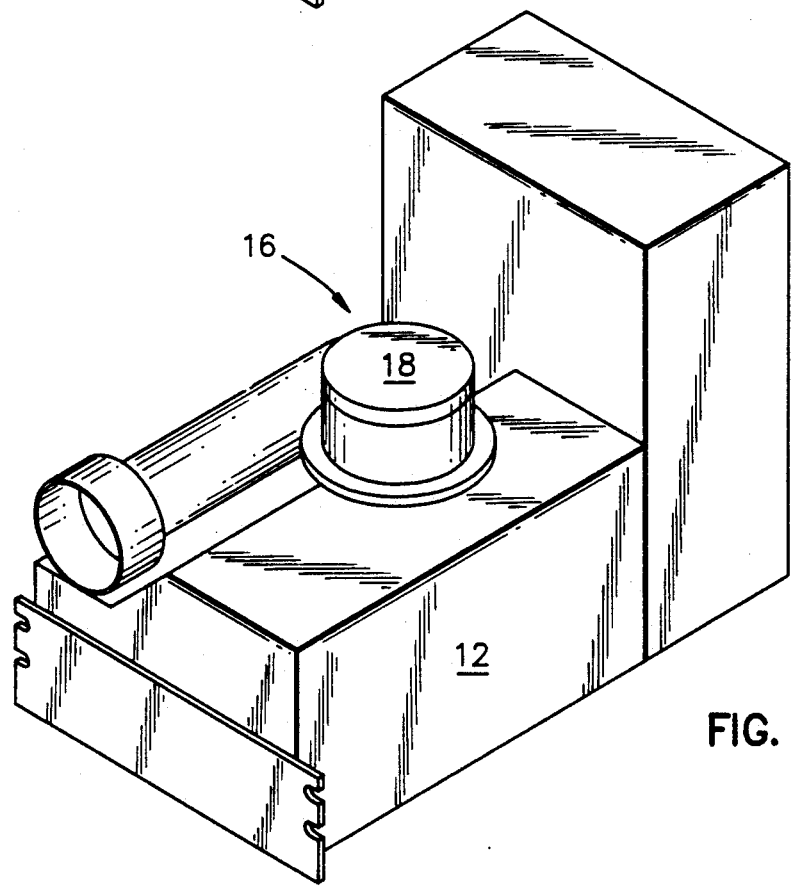
FIG. 2 shows the cryogenic cooling module from FIG. 1 with the LTCM removed to expose the cryogenically-cooled surface.

FIG. 2 illustrates cryogenic cooler assembly 12 with LTCM 10 removed. A cold head 16 is disposed with a mounting surface 18 for making a thermally-conductive contact with an electronic device requiring cryogenic cooling. Cold head 16 can be cryogenically-cooled by any useful means known in the art, such as recirculation of chilled helium gas through an insulated piping contained in assembly 12.

Figure 3:
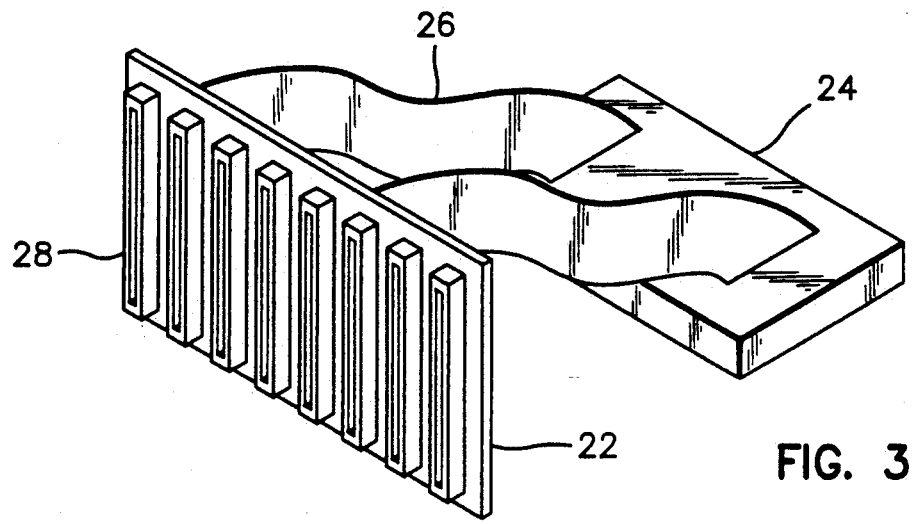
FIG. 3 discloses the multilayer circuit board and processor mounting surface elements of the LTCM of this invention.

FIG. 3 shows the internal components of the LTCM 10 of this invention. A hermetic multilayer circuit board 22 is connected to a processor module mounting plate 24 by one or more flexible bus cables typified by bus cable 26. Mounting plate 24 can accommodate one or more processor chips (not shown) that require cryogenic operating temperatures. Mounting plate 24 is attached to cold head 16 at surface 18 with thermal grease or other suitable means for thermally-conductive connection between the two elements.

Multilayer circuit board 22 contains a plurality of circuit card connectors, typified by connector 28. Connector 28 is adapted for receiving and retaining an air-cooled circuit card, typified by circuit card 30 in FIG. 1. The plurality of air-cooled circuit cards including card 30 are disposed outside of hermetic enclosure 14 such that each card is convectively cooled by air flow. As used herein, "air" includes any mixture of gases. Multilayer circuit board 22 is fabricated by any useful means known in the art for providing a thermal and hermetic barrier between inner and outer surfaces, such as a laminated glass technique without through-holes.

Figure 4:
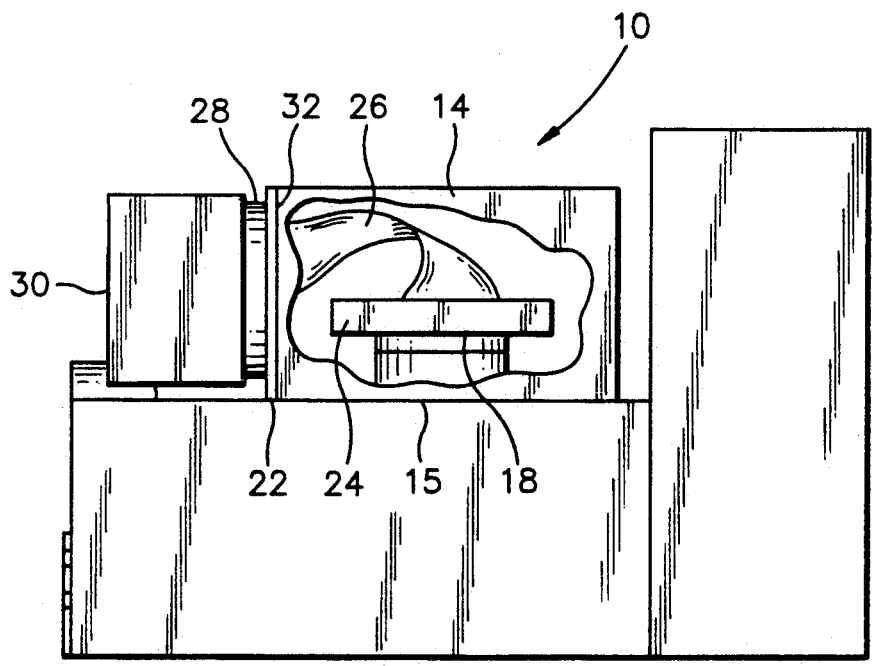
FIG. 4 is a cutaway view illustrating the relative locations of the multilayer circuit board and processor mounting surface within the LTCM of this invention.

FIG. 4 provides a cutaway view of hermetic enclosure 14 showing processor module mounting plate 24 attached to mounting surface 18 in a thermally-conductive fashion such as with thermal grease. Flexible bus cable 26 is disposed between processor module mounting plate 24 and hermetic multilayer circuit board 22 (seen in edge view only). Circuit board 22 must be bonded to enclosure 14 at the junction 32 in any useful manner known in the art for ensuring a hermetic seal, such as with a hermetic silicon rubber O-Ring.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. An electronic assembly comprising:
   a hermetic enclosure having a plurality of surfaces, said enclosure being disposed about a cryogenically-cooled surface;
   a hermetic multilayer circuit board having one or more circuit card connectors, said multilayer circuit board being disposed to form at least part of one said surface of said hermetic enclosure such that said one or more circuit card connectors are located on the outside of said hermetic enclosure;
   a processor module mounting plate disposed within said hermetic enclosure to make thermally-conductive contact with said cryogenically-cooled surface; and
   one or more flexible bus cables disposed within said hermetic enclosure to transfer electrical or optical signals between said processor module mounting plate and said multilayer circuit board.

2. The electronic assembly of claim 1 further comprising:
   one or more air-cooled circuit cards disposed in said one or more circuit card connectors to permit air flow around said one or more air-cooled circuit cards.

3. The electronic assembly of claim 2 wherein:
   said one or more flexible bus cables include paths for electronic or optical signals and paths for electrical ground and electrical power.

4. The electronic assembly of claim 3 wherein:
   said hermetic enclosure is at least partially evacuated.

5. The electronic assembly of claim 1 further comprising:
   at least one processor chip connected to said one or more flexible bus cables.

6. The electronic assembly of claim 5 further comprising:
   one or more air-cooled circuit cards coupled to said one or more circuit card connectors.

7. The electronic assembly of claim 1 wherein:
   said one or more flexible bus cables include paths for electronic or optical signals and paths for electrical ground and electrical power.

8. The electronic assembly of claim 1 wherein:
   said hermetic enclosure is at least partially evacuated.

* * * * *